United States Patent
Koo et al.

(10) Patent No.: US 9,117,636 B2
(45) Date of Patent: Aug. 25, 2015

(54) PLASMA CATALYST CHEMICAL REACTION APPARATUS

(71) Applicant: Colorado State University Research Foundation, Fort Collins, CO (US)

(72) Inventors: Il-Gyo Koo, Daegu (KR); Jin Hoon Cho, Savory, IL (US); Myeong Yeol Choi, Fort Collins, CO (US); Cameron A. Moore, Loveland, CO (US); George J. Collins, Fort Collins, CO (US)

(73) Assignee: Colorado State University Research Foundation, Fort Collins, CO (US)

( * ) Notice: Subject to any disclaimer, the term of this patent is extended or adjusted under 35 U.S.C. 154(b) by 0 days.

(21) Appl. No.: 14/157,254

(22) Filed: Jan. 16, 2014

(65) Prior Publication Data
US 2014/0225498 A1    Aug. 14, 2014

Related U.S. Application Data

(60) Provisional application No. 61/763,250, filed on Feb. 11, 2013.

(51) Int. Cl.
H01J 37/32    (2006.01)

(52) U.S. Cl.
CPC ....... *H01J 37/3255* (2013.01); *H01J 37/32348* (2013.01); *H01J 37/32532* (2013.01); *H01J 37/32541* (2013.01)

(58) Field of Classification Search
None
See application file for complete search history.

(56) References Cited

U.S. PATENT DOCUMENTS

| | | |
|---|---|---|
| 3,434,476 A | 3/1969 | Shaw et al. |
| 3,492,074 A | 1/1970 | Rendina |
| 3,687,832 A | 8/1972 | Fydelor et al. |
| 4,188,426 A | 2/1980 | Auerbach |
| 4,517,495 A | 5/1985 | Piepmeier |
| 4,699,082 A | 10/1987 | Hakim |
| 4,837,484 A | 6/1989 | Eliasson et al. |
| 5,013,959 A | 5/1991 | Kogelschatz |
| 5,041,110 A | 8/1991 | Fleenor |
| 5,194,740 A | 3/1993 | Kogelschatz et al. |
| 5,466,424 A | 11/1995 | Kusano et al. |
| 5,776,255 A | 7/1998 | Asaba et al. |
| 5,780,862 A | 7/1998 | Siess |
| 5,866,871 A | 2/1999 | Birx |
| 5,869,832 A | 2/1999 | Wang et al. |
| 5,945,790 A | 8/1999 | Schaefer |

(Continued)

FOREIGN PATENT DOCUMENTS

| CN | 2391565 Y | 8/2000 |
|---|---|---|
| DE | 3710489 A1 | 11/1987 |

(Continued)

OTHER PUBLICATIONS

Ward et al., "A Significant New Contribution to Radical Head and Neck Surgery"; Arch Otolaryngology, Head and Neck Surg., vol. 115 pp. 921-923 (Aug. 1989).

(Continued)

*Primary Examiner* — Ashok Patel

(57) ABSTRACT

A plasma device is disclosed. The plasma device includes: at least one electrode including a nanoporous dielectric layer disposed on at least a portion thereof, the nanoporous dielectric layer including a plurality of pores, wherein at least a portion of the plurality of pores include a catalyst embedded therein.

8 Claims, 7 Drawing Sheets

(56) References Cited

U.S. PATENT DOCUMENTS

| | | | |
|---|---|---|---|
| 6,153,852 | A | 11/2000 | Blutke et al. |
| 6,172,324 | B1 | 1/2001 | Birx |
| 6,376,972 | B1 | 4/2002 | Tarasenko et al. |
| 6,407,513 | B1 | 6/2002 | Vollkommer et al. |
| 6,488,825 | B1 | 12/2002 | Hilliard |
| 6,501,079 | B1 | 12/2002 | Furuya |
| 7,258,899 | B1 | 8/2007 | Sharma et al. |
| 8,343,090 | B2 | 1/2013 | Rooks et al. |
| 8,575,843 | B2 | 11/2013 | Moore et al. |
| 2003/0038912 | A1 | 2/2003 | Broer et al. |
| 2004/0249006 | A1* | 12/2004 | Gleason et al. ........... 521/61 |
| 2005/0149012 | A1 | 7/2005 | Penny et al. |
| 2005/0153159 | A1 | 7/2005 | Sugiyama et al. |
| 2006/0091109 | A1 | 5/2006 | Partlo et al. |
| 2007/0027440 | A1 | 2/2007 | Altshuler et al. |
| 2007/0029500 | A1 | 2/2007 | Coulombe et al. |
| 2007/0045561 | A1 | 3/2007 | Cooper |
| 2007/0184208 | A1 | 8/2007 | Sharma et al. |
| 2007/0254491 | A1* | 11/2007 | Cheung ................. 438/758 |
| 2008/0122368 | A1 | 5/2008 | Saito et al. |
| 2010/0125267 | A1 | 5/2010 | Lee et al. |
| 2011/0140607 | A1* | 6/2011 | Moore et al. ........ 315/111.21 |
| 2014/0224643 | A1 | 8/2014 | Collins et al. |
| 2014/0225495 | A1 | 8/2014 | Koo et al. |
| 2014/0225498 | A1 | 8/2014 | Koo et al. |
| 2014/0228833 | A1 | 8/2014 | Friedrichs et al. |
| 2014/0257276 | A1 | 9/2014 | Sartor |

FOREIGN PATENT DOCUMENTS

| | | | |
|---|---|---|---|
| DE | 4139029 | A1 | 6/1993 |
| DE | 4326037 | A1 | 2/1995 |
| DE | 9117019 | U1 | 3/1995 |
| DE | 19524645 | A1 | 2/1997 |
| DE | 19537897 | A1 | 3/1997 |
| DE | 9117299 | U1 | 3/2000 |
| DE | 19848784 | A1 | 5/2000 |
| DE | 29724247 | U1 | 8/2000 |
| EP | 0956827 | A1 | 11/1999 |
| FR | 1340509 | A | 10/1963 |
| JP | 61-159953 | A | 7/1986 |
| JP | 2010-242857 | A | 10/2010 |
| SU | 1438745 | A1 | 11/1988 |
| WO | 2009/080273 | A1 | 7/2009 |

OTHER PUBLICATIONS

Lieberman et al., "Capacitive Discharges", Principles of Plasma Discharges and Materials Processing, John Wiley & Son, Inc. (2005) pp. 387-460.

Moore et al., "Confined Geometry Interactions of Downstream RF-Excited Atmospheric Plasma Wires", IEEE Transactions on Plasma Science, 0093-3813, (2008) pp. 1-2.

Walsh et al., "Contrasting Characteristics of Pulsed and Sinusoidal Cold Atmospheric Plasma Jets", Applied Physics Letters, 88, 171501 (2006) pp. 1-3.

Cho et al., "Coplanar ac Discharges Between Cylindrical Electrodes With a Nanoporous Alumina Dielectric: Modular Dielectric Barrier Plasma Devices", IEEE Transactions on Plasma Science, vol. 33, No. 2, (Apr. 2005) pp. 378-379.

Xu et al., "DBD Plasma Jet in Atmospheric Pressure Argon", IEEE Transactions on Plasma Science, vol. 36, No. 4, (Aug. 2008), pp. 1352-1353.

Alfred Grill, "Electron Cyclotron Resonance Plasmas", Cold Plasma in Materials Fabrication, IEEE Press (1994) pp. 40-43.

Brand et al., "Electrosurgical Debulking of Ovarian Cancer: A New Technique Using the Argon Beam Coagulator"; Gynecologic Oncology 39 pp. 115-118 (1990).

Grund et al., "Endoscopic Argon Plasma . . . Flexible Endoscopy"; Endoscopic Surgery and Allied Technologies, No. 1, vol. 2, pp. 42-46 (Feb. 1994).

Waye et al., "Endoscopic Treatment Options"; Techniques in Therapeutic Endoscopy, pp. 1.7-1.15, (1987).

B.D. Cullity, "Introduction to Magnetic Materials", University of Notre Dame; Addison-Wesley Publishing Company, Reading MA., (1972) pp. 23-28.

Brian Chapman, "Matching Networks", Glow Discharge Processes, John Wiley & Sons Inc., NY, (1980) pp. 153-172.

Yin et al., "Miniaturization of Inductively Coupled Plasma Sources", IEEE Transactions on Plasma Science, vol. 27, No. 5, (Oct. 1999) pp. 1516-1524.

Park et al., "Nanoporous Anodic Alumina Film on Glass: Improving Transparency by an Ion-Drift Process", Electrochemical and Solid-State Letters, 8 (3) (2005), pp. D5-D7.

P.A. Tulle, "Off-Resonance Microwave-Created Plasmas", Plasma Physics, Pergamon Press (1973) vol. 15, pp. 971-976.

Lieberman et al., "Ohmic Heating", Principles of Plasma Discharges and Materials Processing, John Wiley & Son, Inc. (2005) pp. 97-98.

Lieberman et al., "Optical Actinometry", Principles of Plasma Discharges and Materials Processing, John Wiley & Son, Inc. (2005) pp. 277-279.

Cho et al., "Ozone Production by Nanoporous Dielectric Barrier Glow Discharge in Atmospheric Pressure Air", Applied Physics Letters, 92, 101504, (2008) pp. 1-3.

Lieberman et al., "Particle and Energy Balance in Discharges", Principles of Plasma Discharges and Materials Processing, John Wiley & Son, Inc. (2005) pp. 329-381.

Woloszko et al., "Plasma Characteristics of Repetitively-Pulsed Electrical Discharges in Saline Solutions Used for Surgical Procedures", IEEE Transactions of Plasma Science, vol. 30, No. 3, (Jun. 2002) pp. 1376-1383.

Stoffels et al., "Plasma Needle for In Vivo Medical Treatment: Recent Developments and Perspectives", Plasma Sources Science and Technology 15 (2006) pp. 169-180.

Schaper et al., "Plasma Production and Vapour Layer Production at a Pulse Power Electrode in Saline Solution:", (2008) www.escampig2008.csic.es/PosterSessions/100.

Akitsu et al., "Plasma Sterilization Using Glow Discharge at Atmospheric Pressure", Surface & Coatings Technology 193, (2005) pp. 29-34.

Koo et al., "Room-temperature Slot Microplasma in Atmospheric Pressure Air Between Cylindrical Electrodes With a Nanoporous Alumina Dielectric", Applied Physics Letters, 91, 041502 (2007) pp. 1-3.

Brian Chapman, "Secondary Electron Emission", Glow Discharge Processes, John Wiley & Sons Inc., NY, (1980) pp. 82-138.

Moore et al., "Sensitive, Nonintrusive, In-Situ Measurement of Temporally and Spatially Resolved Plasma Electric Fields", Physical Review Letters, vol. 52, No. 7, (Feb. 13, 1984) pp. 538-541.

Lieberman et al., "Sheaths", Principles of Plasma Discharges and Materials Processing, John Wiley & Son, Inc. (2005) pp. 11-14.

Farin et al., Technology of Argon Plasma . . . Endoscopic Applications; Endoscopic Surgery and Allied Technologies, No. 1, vol. 2, pp. 71-77 (Feb. 1994).

Lieberman et al., "The Collisionless Sheath", Principles of Plasma Discharges and Materials Processing, John Wiley & Son, Inc. (2005) pp. 167-206.

Gupta et al., "The Potential of Pulsed Underwater Streamer Discharges as a Disinfection Technique", IEEE Transactions on Plasma Science, vol. 36, No. 4, (Aug. 2008) pp. 1621-1632.

Mark H. Mellow, "The Role of Endoscopic Laser Therapy in Gastrointestinal Neoplasms"; Advanced Therapeutic Endoscopy, pp. 17-21, (1990).

Silverstein et al., "Thermal Coagulation Therapy for Upper Gastrointestinal Bleeding"; Advanced Therapeutic Endoscopy, pp. 79-84, 1990.

Sobolewski, Mark A., "Current and Voltage Measurements in the Gaseous Electronics Conference RF Reference Cell". J. Res. Natl. Inst. Stand. Technol. 100, 341; Apr. 1995.

Hernandez et al., "A Controlled Study of the Argon Beam Coagultor for Partial Nephrectomy"; The Journal of Urology, vol. 143, May (1990) J. Urol. 143: pp. 1062-1065.

* cited by examiner

PLASMA CATALYST CHEMICAL REACTION APPARATUS

CROSS-REFERENCE TO RELATED APPLICATION

The present application claims the benefit of and priority to U.S. Provisional Application Ser. No. 61/763,250, filed Feb. 11, 2013, the entire contents of which are incorporated by reference herein.

BACKGROUND

1. Technical Field

The present disclosure relates to plasma devices and processes for surface processing, removal or deposition of biological or other materials. More particularly, the disclosure relates to an apparatus and method for generating and directing chemically reactive, plasma-generated species in a plasma device along with excited-state species (e.g., energetic photons) that are specific to the selected ingredients.

2. Background of Related Art

Electrical discharges in dense media, such as liquids and gases at or near atmospheric pressure, can, under appropriate conditions, result in plasma formation. Plasmas have the unique ability to create large amounts of chemical species, such as ions, radicals, electrons, excited-state (e.g., metastable) species, molecular fragments, photons, and the like. The plasma species may be generated in a variety of internal energy states or external kinetic energy distributions by tailoring plasma electron temperature and electron density. In addition, adjusting spatial, temporal and temperature properties of the plasma creates specific changes to the material being irradiated by the plasma species and associated photon fluxes. Plasmas are also capable of generating photons including vacuum ultraviolet photons that have sufficient energy to initiate photochemical and photocatalytic reaction paths in biological and other materials that are irradiated by the plasma.

SUMMARY

Plasmas have broad applicability to provide alternative solutions to industrial, scientific and medical needs, especially workpiece surface processing at low temperature. Plasmas may be delivered to a workpiece, thereby affecting multiple changes in the properties of materials upon which the plasmas impinge. Plasmas have the unique ability to create large fluxes of radiation (e.g., ultraviolet), ions, photons, electrons and other excited-state (e.g., metastable) species which are suitable for performing material property changes with high spatial, material selectivity, and temporal control. Selective plasma may also remove a distinct upper layer of a workpiece but have little or no effect on a separate underlayer of the workpiece or it may be used to selectively remove a particular tissue type from a mixed tissue region or selectively remove a tissue with minimal effect to adjacent organs of different tissue type, e.g., removal of extra cellular matrix.

One suitable application of the unique chemical species is to drive non-equilibrium or selective chemical reactions at or within the workpiece to provide for selective removal of only certain types of materials. Such selective processes are especially sought in biological tissue processing (e.g., mixed or multi-layered tissue), which allows for cutting and removal of tissue at low temperatures with differential selectivity to underlayers and adjacent tissues. This is particularly useful for removal of extra cellular metrices, biofilms, mixtures of fatty and muscle tissue, and debridement of surface layers.

The plasma species are capable of modifying the chemical nature of tissue surfaces by breaking chemical bonds, substituting or replacing surface-terminating species (e.g., surface functionalization) through volatilization, gasification or dissolution of surface materials (e.g., gas and liquid base etching). With proper techniques, material choices and conditions, one can selectively remove one type of tissue entirely without affecting a nearby different type of tissue. Controlling plasma conditions and parameters (including S-parameters, V, I, Θ, and the like) allows for the selection of a set of specific plasma particles, which, in turn, allows for selection of chosen chemical pathways for material removal or modification as well as selectivity of removal of desired tissue type. The present disclosure provides a system and method for creating plasma under a broad range of conditions including tailored geometries, various plasma feedstock media, number and location of electrodes and electrical excitation parameters (e.g., voltage, current, phase, frequency, pulse condition, etc.) all of which affect selectivity of the plasma to the plasma irradiated work piece.

The supply of electrical energy that ignites and sustains the plasma discharge is delivered through substantially conductive electrodes that are capacitively or inductively coupled with the ionizable media and other plasma feedstocks. The present disclosure also provides methods and apparatus that utilize specific electrode structures that improve and enhance desirable aspects of plasma operation such as higher electron temperature, greater catalytic effect on feedstocks and higher amount of secondary emission. In particular, the present disclosure provides porous media both for controlled release of chemical reactants and for holding catalytic materials.

The plasma includes electrons, radicals, metastable species and photons that drive the reaction at the workpiece, including energetic electrons delivered thereto. Controlling plasma conditions and parameters allows for selection of a set of specific particles, which, in turn, allows for selection of chemical pathways for material removal or modification as well as selectivity of removal of desired tissue type. The present disclosure also provides a system and method for generating plasmas that operate at or near atmospheric pressure. The plasmas include electrons that drive reactions at material surfaces in concert with other plasma species. Electrons delivered to the material surface can initiate a variety of processes including bond scission, which enables volatilization in subsequent reactions. Tailored plasmas may enhance polymerization of monomers. The electron-driven reactions act synergistically with associated fluxes to achieve removal rates of material greater than either of the reactions acting alone.

According to one embodiment of the present disclosure, a plasma device is disclosed. The plasma device includes: at least one electrode including a nanoporous dielectric layer disposed on at least a portion thereof, the nanoporous dielectric layer including a plurality of pores, wherein at least a portion of the plurality of pores include a catalyst embedded therein.

According to one aspect of the above embodiment, the dielectric coating is selected from the group consisting of an oxide, a nitride, a native oxide and a native nitride.

According to one aspect of the above embodiment, the metal alloy is selected from the group consisting of an aluminum alloy and a titanium alloy.

According to one aspect of the above embodiment, the catalyst is selected from the group consisting of ruthenium, rhodium, palladium, silver, osmium, iridium, platinum, gold, nickel, copper, cobalt, iron, and oxides and bimetal combinations thereof.

According to one aspect of the above embodiment, the plasma device further includes: an outer electrode having a substantially cylindrical tubular shape defining a lumen therethrough; and an inner electrode coaxially disposed within lumen, the inner electrode having a substantially cylindrical tubular shape.

According to one embodiment of the present disclosure, a plasma system is disclosed. The plasma system includes: a plasma device having at least one electrode including a nanoporous dielectric layer disposed on at least a portion thereof, the nanoporous dielectric layer including a plurality of pores, wherein at least a portion of the plurality of pores include a catalyst embedded therein; an ionizable media source coupled to the plasma device and configured to supply ionizable media thereto; and a power source coupled to the inner and outer electrodes and configured to ignite the ionizable media at the plasma device to form a plasma effluent.

According to one aspect of the above embodiment, the dielectric coating is selected from the group consisting of an oxide, a nitride, a native oxide and a native nitride.

According to one aspect of the above embodiment, the metal alloy is selected from the group consisting of an aluminum alloy and a titanium alloy.

According to one aspect of the above embodiment, the catalyst is selected from the group consisting of ruthenium, rhodium, palladium, silver, osmium, iridium, platinum, gold, nickel, copper, cobalt, iron, and oxides and bimetal combinations thereof.

According to one aspect of the above embodiment, the plasma device further includes: an outer electrode having a substantially cylindrical tubular shape defining a lumen therethrough; and an inner electrode coaxially disposed within lumen, the inner electrode having a substantially cylindrical tubular shape.

According to one embodiment of the present disclosure, a method is disclosed. The method includes: forming a nanoporous dielectric layer including a plurality of pores on at least a portion of an electrode; and embedding at least a portion of the plurality of pores with a catalyst.

According to one aspect of the above embodiment, forming of the nanoporous dielectric layer further includes: electropolishing at least a portion of the electrode.

According to one aspect of the above embodiment, forming of the nanoporous dielectric layer further includes: forming an intermediate dielectric layer on the electropolished portion of the electrode by anodizing the electropolished portion.

According to one aspect of the above embodiment, forming of the nanoporous dielectric layer further includes: removing the intermediate dielectric layer from the electropolished portion to form a plurality of protuberances on the electrode.

According to one aspect of the above embodiment, forming of the nanoporous dielectric layer further includes: forming the nanoporous dielectric layer including the plurality of pores on the plurality of protuberances.

According to one aspect of the above embodiment, forming of the nanoporous dielectric layer further includes: removing a portion of the plurality of pores contacting the plurality of protuberances.

According to one aspect of the above embodiment, forming of the nanoporous dielectric layer further includes: widening the plurality of pores.

According to one aspect of the above embodiment, forming of the nanoporous dielectric layer further includes: submerging the nanoporous dielectric layer in a solution of a salt of the catalyst.

BRIEF DESCRIPTION OF THE DRAWINGS

The accompanying drawings, which are incorporated in and constitute a part of this specification, illustrate exemplary embodiments of the disclosure and, together with a general description of the disclosure given above, and the detailed description of the embodiments given below, serve to explain the principles of the disclosure, wherein.

DETAILED DESCRIPTION

Plasmas are generated using electrical energy that is delivered as either direct current (DC) electricity or alternating current (AC) electricity, in either continuous or pulsed modes, at frequencies from about 0.1 hertz (Hz) to about 100 gigahertz (GHz), including radio frequency ("RF", from about 0.1 MHz to about 100 MHz) and microwave ("MW", from about 0.1 GHz to about 100 GHz) bands, using appropriate generators, electrodes, and antennas. Choice of excitation frequency, the workpiece, as well as the electrical circuit that is used to deliver electrical energy to the circuit affects many properties and requirements of the plasma. The performance of the plasma chemical generation, the gas or liquid feedstock delivery system and the design of the electrical excitation circuitry are interrelated—as the choices of operating voltage, frequency and current levels, as well as phase, affect the electron temperature and electron density. Further, choices of electrical excitation and plasma device hardware also determine how a given plasma system responds dynamically to the introduction of new ingredients to the host plasma gas or liquid media. The corresponding dynamic adjustment of the electrical drive, such as via dynamic match networks or adjustments to voltage, current, or excitation frequency may be used to maintain controlled power transfer from the electrical circuit to the plasma.

Figure 1:
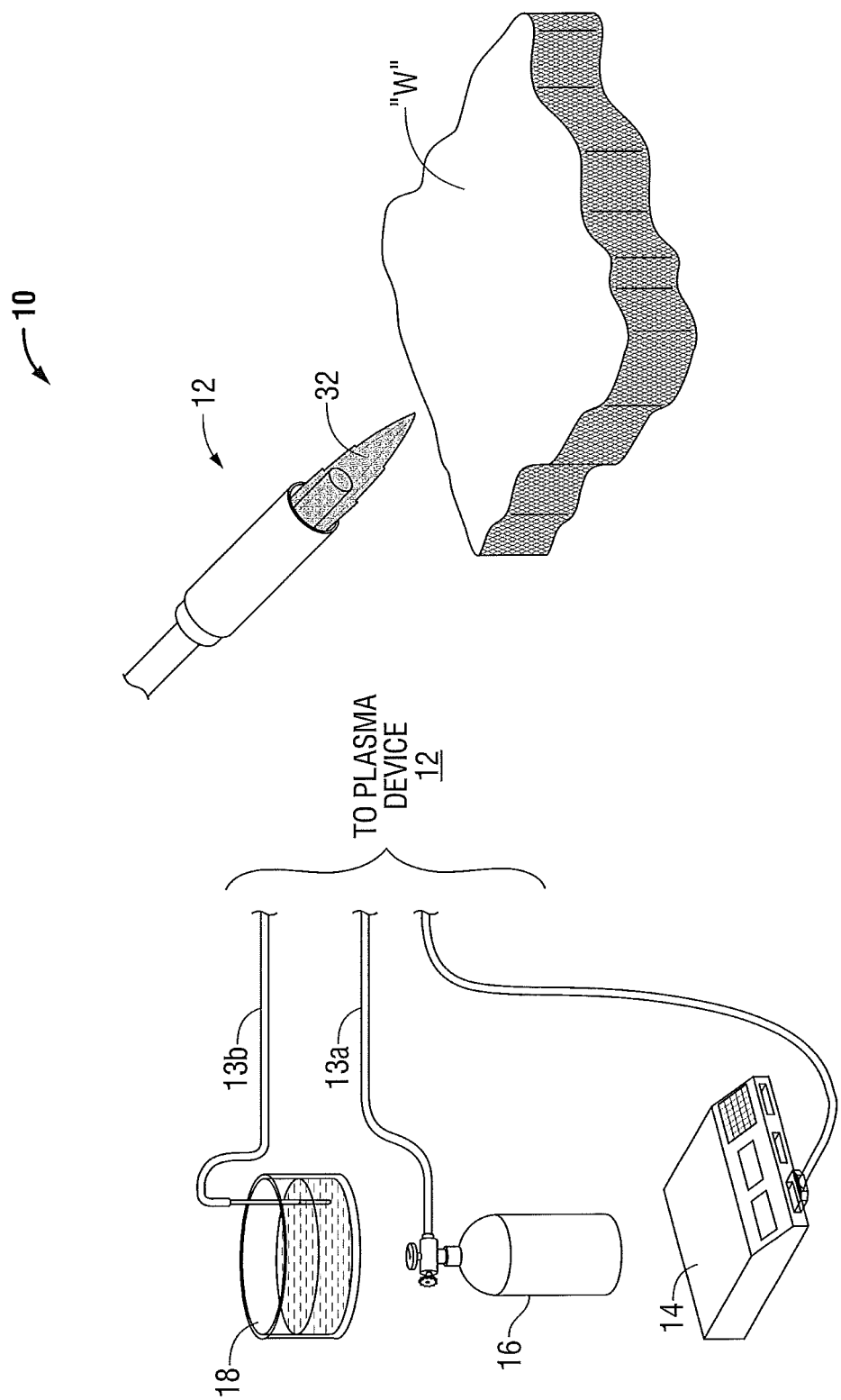
FIG. 1 is a schematic diagram of a plasma system according to the present disclosure.

Referring initially to FIG. 1, a plasma system 10 is disclosed. The system 10 includes a plasma device 12 that is coupled to a power source 14, an ionizable media source 16 and a precursor or pre-ionization source 18. Power source 14 includes any suitable components for delivering power or matching impedance to plasma device 12. More particularly, the power source 14 may be any radio frequency generator or other suitable power source capable of producing electrical power to ignite and sustain the ionizable media to generate a plasma effluent 32. The plasma device 12 may be utilized as an electrosurgical pencil for application of plasma to tissue and the power source 14 may be an electrosurgical generator that is adapted to supply the device 12 with electrical power at a frequency from about 0.1 MHz to about 2,450 MHz and in another embodiment from about 1 MHz to about 160 MHz. The plasma may also be ignited by using continuous or pulsed direct current (DC) electrical energy or continuous or pulsed RF electrical energy or combinations thereof.

The precursor source 18 may include a bubbler or a nebulizer configured to aerosolize precursor feedstocks prior to introduction thereof into the device 12. In embodiments, the precursor source 18 may also include a micro droplet or injector system capable of generating predetermined refined droplet volume of the precursor feedstock from about 1 femtoliter to about 1 nanoliter in volume. The precursor source 18 may also include a microfluidic device, a piezoelectric pump, or an ultrasonic vaporizer.

The system 10 provides a flow of plasma through the device 12 to a workpiece "W" (e.g., tissue). Plasma feedstocks, which include ionizable media and precursor feedstocks, are supplied by the ionizable media source 16 and the precursor source 18, respectively, to the plasma device 12. During operation, the precursor feedstock and the ionizable media are provided to the plasma device 12 where the plasma feedstocks are ignited to form plasma effluent 32 containing ions, radicals, photons from the specific excited species and metastables that carry internal energy to drive desired chemical reactions in the workpiece "W" or at the surface thereof. The feedstocks may be mixed upstream from the ignition point or midstream thereof (e.g., at the ignition point) of the plasma effluent, as shown in FIG. 1 and described in more detail below.

The ionizable media source 16 provides ionizable feedstock gas mix to the plasma device 12. The ionizable media source 16 is coupled to the plasma device 12 and may include a storage tank and a pump (not explicitly shown). The ionizable media may be a liquid or a gas such as argon, helium, neon, krypton, xenon, radon, carbon dioxide, nitrogen, hydrogen, oxygen, etc. and their mixtures, and the like, or a liquid. These and other gases may be initially in a liquid form that is gasified during application.

The precursor source 18 provides precursor feedstock to the plasma device 12. The precursor feedstock may be either in solid, gaseous or liquid form and may be mixed with the ionizable media in any state, such as solid, liquid (e.g., particulates, nanoparticles or droplets), gas, and the combination thereof. The precursor source 18 may include a heater, such that if the precursor feedstock is liquid, it may be heated into gaseous state prior to mixing with the ionizable media.

In one embodiment, the precursors may be any chemical species capable of forming reactive species such as ions, electrons, excited-state (e.g., metastable) species, molecular fragments (e.g., radicals) and the like, when ignited by electrical energy from the power source 14 or when undergoing collisions with particles (electrons, photons, or other energy-bearing species of limited and selective chemical reactivity) formed from ionizable media 16. More specifically, the precursors may include chemical compounds having various reactive functional groups, such as acyl halide, alcohol, aldehyde, alkane, alkene, amide, amine, butyl, carboxlic, cyanate, isocyanate, ester, ether, ethyl, halide, haloalkane, hydroxyl, ketone, methyl, nitrate, nitro, nitrile, nitrite, nitroso, peroxide, hydroperoxide, oxygen, hydrogen, nitrogen, and combination thereof. In embodiments, the chemical precursors may be water, halogenoalkanes, such as dichloromethane, trichloromethane, carbon tetrachloride, difluoromethane, trifluoromethane, carbon tetrafluoride, and the like; peroxides, such as hydrogen peroxide, acetone peroxide, benzoyl peroxide, and the like; alcohols, such as methanol, ethanol, isopropanol, ethylene glycol, propylene glycol, alkalines such as NaOH, KOH, amines, alkyls, alkenes, and the like. Such chemical precursors may be applied in substantially pure, mixed, or soluble form.

The precursors and their functional groups as well as nanoparticles may be delivered to a surface to react with the surface species (e.g., molecules) of the workpiece "W." In other words, the functional groups may be used to modify or replace existing chemical surface terminations of the workpiece "W." The functional groups react readily with the surface species due to their high reactivity and the reactivity imparted thereto by the plasma. In addition, the functional groups are also reacted within the plasma volume prior to delivering the plasma volume to the workpiece.

Some functional groups generated in the plasma can be reacted in situ to synthesize materials that subsequently form a deposition upon the surface. This deposition may be used for stimulating healing, killing bacteria, and increasing hydrophilic or hydroscopic properties to minimize tissue sticking to the electrode or to other tissue. In addition, deposition of certain function groups may also allow for encapsulation of the surface to achieve predetermined gas/liquid diffusion (e.g., allowing gas permeation but preventing liquid exchange), to bond or stimulate bonding of surfaces, or to apply as a physically protective layer.

The ionizable media source 16 and the precursor source 18 and may be coupled to the plasma device 12 via tubing 13a and 13b, respectively. The tubing 13a and 13b may be combined into a single tubing (e.g., via a Y coupling) to deliver a mixture of the ionizable media and the precursor feedstock to the device 12 at a proximal end thereof. This allows for the plasma feedstocks, e.g., the precursor feedstocks, nanoparticles and the ionizable gas, to be delivered to the plasma device 12 simultaneously prior to ignition of the mixture therein.

In another embodiment, the ionizable media source 16 and the precursors source 18 may be coupled to the plasma device 12 via the tubing 13a and 13b at separate connections, such that the mixing of the feedstocks occurs within the plasma device 12 upstream from the ignition point. In other words, the plasma feedstocks are mixed proximally of the ignition point, which may be any point between the respective sources 16 and 18 and the plasma device 12, prior to ignition of the plasma feedstocks to create the desired mix of the plasma effluent species flux (e.g., particles/cm$^2$ sec) for each specific surface treatment on the workpiece "W."

In a further embodiment, the plasma feedstocks may be mixed midstream, e.g., at the ignition point or downstream of the plasma effluent, directly into the plasma effluent 32. More specifically, the tubing 13a and 13b may be coupled to the device 12 at the ignition point, such that the precursor feedstocks and the ionizable media are ignited concurrently as they are mixed. It is also envisioned that the ionizable media may be supplied to the device 12 proximally of the ignition point, while the precursor feedstocks are mixed therewith at the ignition point.

In a further illustrative embodiment, the ionizable media may be ignited in an unmixed state and the precursors may be mixed directly into the ignited plasma effluent 32. Prior to mixing, the plasma feedstocks may be ignited individually. The plasma feedstock is supplied at a predetermined pressure to create a flow of the medium through the device 12, which aids in the reaction of the plasma feedstocks and produces the plasma effluent 32. The plasma effluent 32 according to the present disclosure is generated at or near atmospheric pressure under normal atmospheric conditions.

Figure 2:
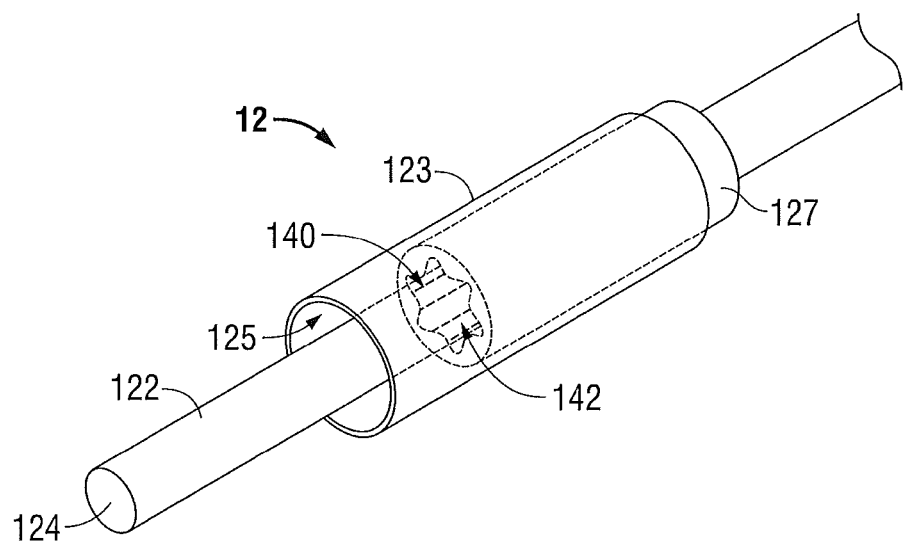
FIG. 2 is a perspective, cross-sectional perspective view of The plasma device according to the present disclosure.
Figure 3:
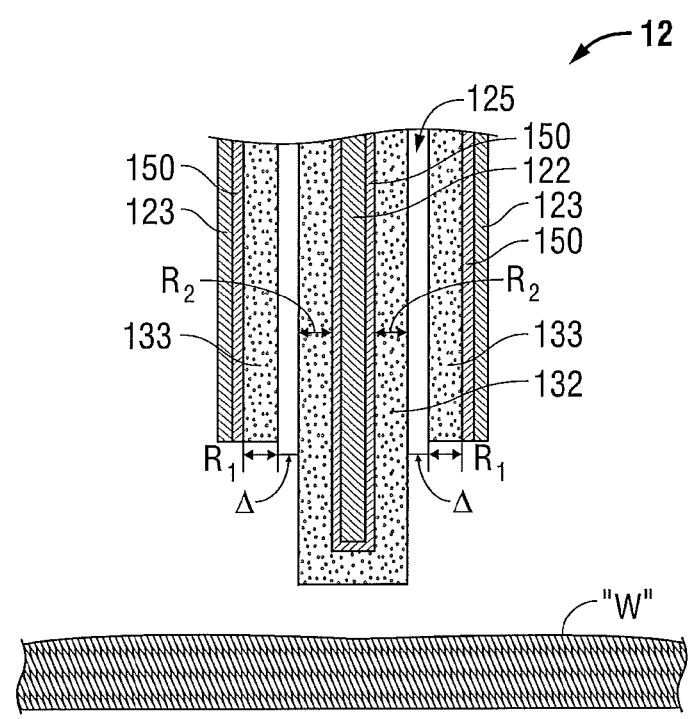
FIG. 3 is a side, cross-sectional view of the plasma device of FIG. 2.

With reference to FIGS. 2 and 3, the device 12 includes an inner electrode 122 disposed coaxially within an outer electrode 123. As shown in FIG. 2, the outer electrode 123 has a substantially cylindrical tubular shape having a lumen 125 defined therethrough. The inner electrode 122 has a substantially cylindrical shape (e.g., rod-shaped) having a closed distal portion 124. The electrodes 122 and 123 may be formed from a conductive material suitable for ignition of plasma such as metals and metal-ceramic composites. In one embodiment, the electrodes 122 and 123 may be formed from a conductive metal including a native oxide or nitride compound disposed thereon.

The device 12 also includes an electrode spacer 127 disposed between the inner and outer electrodes 122 and 123. The electrode spacer 127 may be disposed at any point between the inner and outer electrodes 122 and 123 to provide for a coaxial configuration between the inner and outer electrodes 122 and 123. The electrode spacer 127 includes a central opening 140 adapted for insertion of the inner electrode 122 therethrough and one or more flow openings 142 disposed radially around the central opening 140 to allow for the flow of ionizable media and precursors through the device 12. In embodiments, the electrode spacer 127 may be formed from a dielectric material, such as ceramic, to provide for capacitive coupling between the inner and outer electrodes 122 and 123.

The electrode spacer 127 may be frictionally fitted to the electrodes 122 and 123 to secure the inner electrode 122 within the outer electrode 123. In another embodiment, the electrode spacer 127 may be secured to the outer electrode 123 but be slidably disposed over the inner electrode 122. This configuration provides for longitudinal adjustment of the distal portion 124 of the inner electrode 122 relative to the outer electrode 123 to achieve a desired spatial relationship between the electrodes 122 and 123 (e.g., controlling the exposure of the distal portion 124 of the inner electrode 122).

In embodiments, the distal portion 124 of the inner electrode 122 may be extended past the distal end of the outer electrode 123. In another embodiment, the distal portion 124 of the inner electrode 122 may be retracted into the lumen 125, such that the distal portion 124 is fully enclosed by the outer electrode 123. In a further embodiment, the distal portion 124 of the inner electrode 122 may be flush with the distal end of the outer electrode 123.

One of the electrodes 122 and 123 may be an active electrode and the other may be a neutral (e.g., indifferent) or return electrode to facilitate in RF energy coupling through an isolation transformer (not shown) disposed within the generator 14 to provide electrical isolation with the workpiece "W." Each of the electrodes 122 and 123 are coupled to the power source 14 that drives plasma generation, such that the energy from the power source 14 may be used to ignite the plasma feedstocks flowing through the device 12. More specifically, the ionizable media and the precursors flow through the device 12 through the openings 142 and the lumen 125 (e.g., through the electrode spacer 127 and between the inner and outer electrodes 122 and 123). When the electrodes 122 and 123 are energized, the plasma feedstocks are ignited and form the plasma effluent 32 which is emitted from the distal end of the device 12 onto the workpiece "W."

As shown in FIG. 3, the inner electrode 122 and outer electrode 123 may include a coating 150 formed from an insulative or semiconductive material deposited as a film unto the inner conductor (e.g., atomic layer deposition) or as a dielectric sleeve or layer. The coating is disposed on the outer surface of the inner electrode 122 and on the inner surface of the outer electrode 123. In other words, the surfaces of the inner and outer electrodes 122 and 123 facing the lumen 125 include the coating 150. In one embodiment, the coating may cover the entire surface of the inner and outer electrodes 122 and 123 (e.g., outer and inner surface thereof, respectively). In another embodiment, the coating may cover only a portion of the electrodes 122 and 123.

The coating may be a nanoporous native oxide, or a native nitride of the metal from which the inner and outer electrodes are formed, or may be a deposited layer or a layer formed by ion implantation. In embodiments, the inner and outer electrodes 122 and 123 are formed from an aluminum alloy and the coating is aluminum oxide ($Al_2O_3$) or aluminum nitride (AlN). In another illustrative embodiment, the inner and outer electrodes 122 and 123 are formed from a titanium alloy and the coating is titanium oxide ($TiO_2$) or titanium nitride (TiN). In embodiments, the coating may also be a non-native metal oxide or nitride, such as zinc oxide ($ZnO_2$) and magnesium oxide (MgO). The coating may also be used to reduce tissue sticking to prevent tissue sticking to the electrode.

The inner and outer electrodes 122 and 123 and the coating 150 may also be configured as a heterogeneous system. The inner and outer electrodes 122 and 123 may be formed from any suitable electrode substrate material (e.g., conductive metal or a semiconductor) and the coating may be disposed thereon by various coating processes. The coating may be formed on the inner and outer electrodes 122 and 123 by exposure to an oxidizing environment, anodization, electrochemical processing, ion implantation, or deposition (e.g., sputtering, chemical vapor deposition, atomic layer deposition, etc.).

In another embodiment the coating on electrodes 122 and 123 may be different on each electrode and may serve separate purposes. One coating 150 (e.g., on the electrode 122) can be selected to promote increased secondary electron emission while coating on the other electrode (e.g., electrode 123) can be selected to promote specific chemical reactions (e.g., act as a catalyst).

In embodiments, the coating provides capacitive coupling between the inner and outer electrodes 122 and 123. The resulting capacitive circuit element structure provides a net negative bias potential at the surface of the inner and outer electrodes 122 and 123, which attracts the ions and other species from the plasma effluent. These species then bombard the coating 150 and release energetic electrons.

Materials having high secondary electron emission property, $\gamma$, in response to ion and/or photon bombardment are suitable for forming the coating 150. Such materials include insulators and/or semiconductors. These materials have a relatively high $\gamma$, where $\gamma$ represents the number of electrons emitted per incident bombardment particle. Thus, metals generally have a low $\gamma$ (e.g., less than 0.1) while insulative and semiconductor materials, such as metallic oxides have a high $\gamma$, from about 1 to about 10 with some insulators exceeding a value of 20. Thus, the coating 150 acts as a source of secondary emitted electrons.

Secondary electron emission, γ, may be described by the formula (1):

$$\gamma = \Gamma_{secondary} / \Gamma_{ion} \quad (1)$$

In formula (1) γ is the secondary electron emission yield or coefficient, $\Gamma_{secondary}$ is the electron flux, and $\Gamma_{ion}$ is the ion flux. Secondary emission occurs due to the impacts of plasma species (e.g., ions) onto the coating 150 when the ion impact collisions have sufficient energy to induce secondary electron emission, thus generating γ-mode discharges. Generally discharges are said to be in γ-mode when electron generation occurs at electrode surfaces (i.e., γ>1) instead of in the gas (an α-mode discharge). In other words, per each ion colliding with the coating 150, a predetermined number of secondary electrons are emitted. Thus, γ may also be thought of as a ratio of the $\Gamma_{secondary}$ (e.g., the electron flux) and $\Gamma_{ion}$ (e.g., the ion flux).

These ion collisions with the surface of the coating 150, in turn, provide sufficient energy for secondary electron emission to generate γ discharges. The ability of coating materials to generate γ discharges varies with several parameters, with the most influence due to the choice of materials having a high γ as discussed above. This property allows coating 150 to act as a source of secondary emitted electrons or as a catalytic material to enhance selected chemical reaction paths.

Over time the coating 150 may thin or be removed during the plasma operation. In order to maintain the coating 150 to continually provide a source of secondary emitted electrons, the coating 150 may be continually replenished during the plasma operation. This may be accomplished by adding species that reformulate the native coating on the inner and outer electrodes 122 and 123. In one embodiment, the precursor source 18 may provide either oxygen or nitrogen gas to the device 12 to replenish to oxide or nitride coating.

Secondary electron emission forms sheath layers 132 and 133 about the inner and outer electrodes 122 and 123, respectively. The sheath layers 132 and 133 have working ranges $R_1$ and $R_2$, which are representative of the thickness of energetic electron sheath layers 132 and 133 disposed about the inner and outer electrodes 122 and 123. In other words, ranges $R_1$ and $R_2$ indicate regions with a greatly increased concentration of electrons with relatively high energies that drive dissociation reactions in the gas phase. The coating 150 on electrodes 122 and/or 123 can increase or enhance working ranges $R_1$ and $R_2$ of energetic secondary electrons. In particular, varying the thickness of the coating 150 can be used to adjust the working ranges $R_1$ and $R_2$. A gap distance Δ shows the zone where the concentration of energetic secondary electrons is relatively lower. Coating the electrodes, as discussed above, reduces gap distance Δ. In some embodiments, distance Δ may be reduced to zero and/or working ranges $R_1$ and $R_2$ may overlap thereby creating an hollow cathode effect.

Formation of the sheath layers 132 and 133 is also controlled by the supply of the ionizable media and the precursors. Ionizable media and the precursors are selected that are relatively transparent to the energetic electrons released during secondary emission from the surface of the coating 150. As stated above, the plasma is generated at atmospheric pressure. Due to the increased entropy at such pressure, the generated electrons undergo a multitude of collisions in a relatively short period of time and space forming the sheath layers 132 and 133.

Figure 4A:
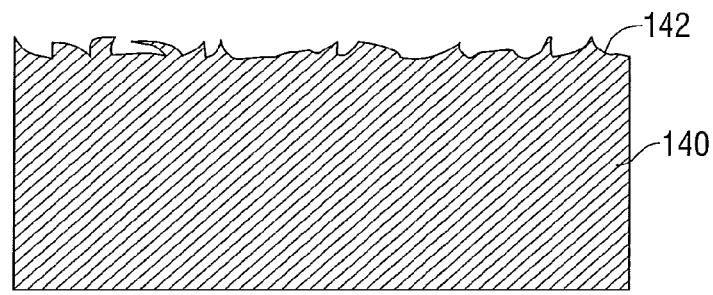
FIGS. 4A-4H are enlarged, cross-sectional views of a portion of an electrode surface of the plasma device of FIG. 2.
Figure 4B:
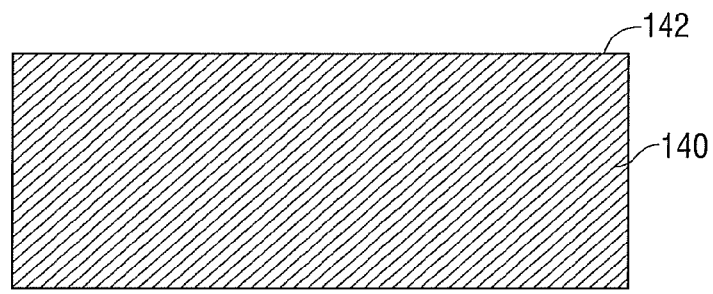
Figure 4C:
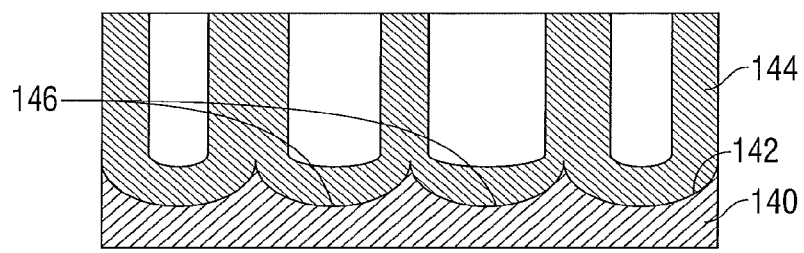
Figure 4D:
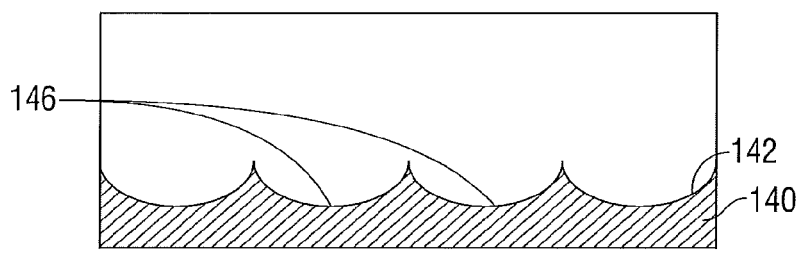
Figure 4E:
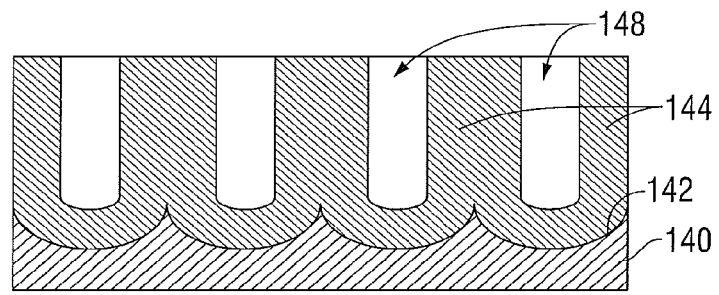
Figure 4F:
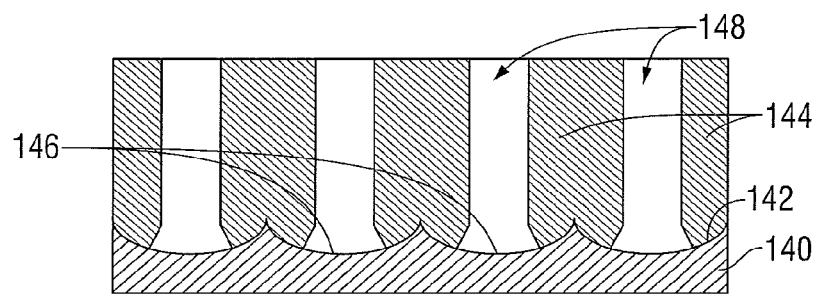
Figure 4G:
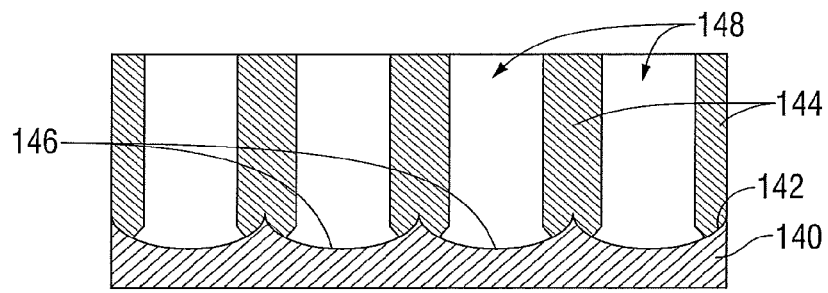
Figure 4H:
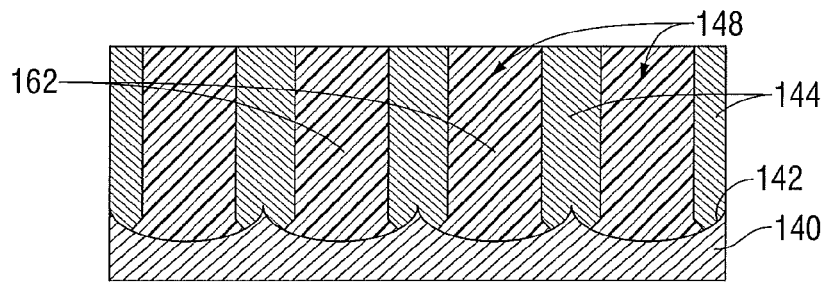

With reference to FIGS. 4A-4H, the coating 150 may also include a plurality of nanostructured pores 148, which may be arranged in a predetermined (e.g., unidirectional) or random manner and may be treated to include one or more types of catalyst materials 162 disposed therein (FIG. 4H). The catalyst materials 162 are suitable for initiation of the chemical reactions within the plasma effluent 32.

Figure 5:
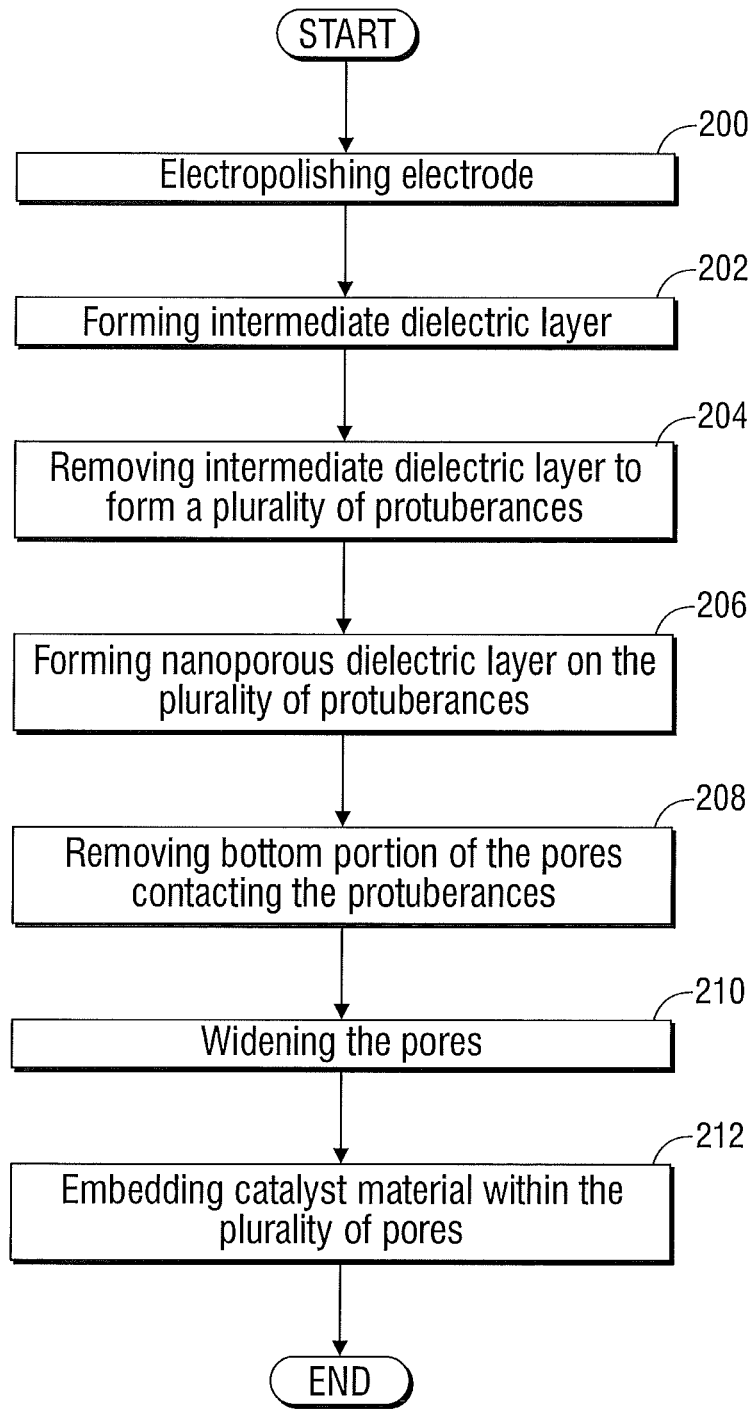
FIG. 5 shows a flow chart illustrating a method for forming a porous coating on the electrodes of the plasma device of FIG. 2.

FIG. 5 in conjunction with FIGS. 4A-4G illustrate a method of forming the coating 150 on a substrate 140 (e.g., surface of the inner and outer electrodes 122 and 123) having a top surface 142. As discussed above, the substrate 140 may be formed from a conductive metal such as aluminum, titanium and the like. In step 200, the substrate 140 is polished using any suitable technique, such as abrasive polishing to remove rough edges from the top surface 142 as shown in FIG. 4A. The substrate 140 may be subsequently electro-polished to smooth out the surface 142 on a nano-scale level as shown in FIG. 4B.

In one embodiment, electro-polishing may be accomplished by submerging the substrate 140 in an acidic solution having a pH from about 1 pH to about 7 pH, in embodiments, from about 1 pH to about 4 pH at a temperature of from about 0° C. to about 50° C., in embodiments, from about 0° C. to about 5° C. for a period of from about 0.1 minutes to about 100 minutes, in embodiments, from about 0.1 minutes to about 10 minutes and supplying a DC voltage to the solution of from about 1 V to about 300 V, in embodiments, from about 10 V to about 30 V. The solution may be an aqueous solution or an alcohol may be used as a solvent. Examples of suitable acids for electro-polishing include perchloric acid, nitric acid, sulfuric acid and combinations thereof. Examples of alcohols suitable for electro-polishing include ethanol, methanol, 2-propanol and combinations thereof.

In step 202, the polished substrate 140 is anodized. This may be accomplished by submerging the substrate 140 in an acidic solution having a pH from about 1 pH to about 7 pH, in embodiments, from about 1 pH to about 3 pH at a temperature of from about 0° C. to about 100° C., in embodiments, from about 5° C. to about 20° C. for a period of from about 1 minutes to about 3,000 minutes, in embodiments, from about 120 minutes to about 300 minutes and supplying a voltage to the solution of from about 2 V to about 500 V, in embodiments, from about 20 V to about 50 V. Examples of suitable acids for anodization include oxalic acid, chromic acid, sulfuric acid, phosphoric acid, sulfosalicylic acid, and combinations thereof. Anodization removes a top surface layer of the substrate 140 and forms metal-oxide formations 144 on the top surface 142 forming an intermediate metal oxide layer as shown in FIG. 4C. Removal of the top surface layer also produces concave protuberances 146 on the top surface 142.

In step 204, the metal-oxide formations 144 are removed as shown in FIG. 4D, such that the protuberances 146 are exposed. This may be accomplished by submerging the substrate 140 in an acidic solution having a pH from about 1 pH to about 7 pH, in embodiments, from about 1 pH to about 3 pH at a temperature of from about 0° C. to about 100° C., in embodiments, from about 40° C. to about 80° C. for a period of from about 1 minutes to about 3000 minutes, in embodiments, from about 120 minutes to about 300 minutes. Examples of suitable acids for removing native metal-oxide formations 144 include oxalic acid, chromic acid, sulfuric acid, phosphoric acid, sulfosalicylic acid, and combinations thereof.

In step 206, the substrate 140 having the protuberances 146 is anodized the second time. This may be accomplished by submerging the substrate 140 in an acidic solution having a pH from about 1 pH to about 7 pH, in embodiments, from about 1 pH to about 3 pH at a temperature of from about 0° C. to about 100° C., in embodiments, from about 5° C. to about 20° C. for a period of from about 1 minutes to about 3000 minutes, in embodiments, from about 120 minutes to about 300 minutes and supplying a voltage to the solution of from about 1 V to about 5000 V, in embodiments, from about 20 V to about 500 V. The second anodization rebuilds the metal-oxide formations 144 as shown in FIG. 4E that are more uniform than the formations 144 formed in step 202 (FIG. 4C).

In step 208, pores 148 are formed within each of the metal-oxide formations 144 as shown in FIG. 4F. In other words, the bottom metal-oxide portion of each of the metal-oxide formations 144 contacting the protuberances 146 is removed, such that the protuberances 146 are exposed. This may be accomplished by submerging the substrate 140 in an acidic solution having a pH from about 1 pH to about 7 pH, in embodiments, from about 1 pH to about 3 pH at a temperature of from about 0° C. to about 100° C., in embodiments, from about 5° C. to about 20° C. for a period of from about 1 minutes to about 1000 minutes, in embodiments, from about 120 minutes to about 300 minutes and supplying a voltage to the solution of from about 200 V to about 5 V, in embodiments, from about 20 V to about 50 V. The pore formation process may be performed within the same solution as the second anodization (e.g., step 206) with the voltage decreased from about 500 V to about 1 V, in embodiments, from about 50 V to about 5 V at a rate of from about 0.01 V/s to about 20 V/s, in embodiment from about 0.1 V/s to about 2 V/s. The decrease in voltage removes the lower portion of the metal-oxide formations 144 exposing a portion of the protuberances 146.

In step 210, the pores 148 are widened at the base thereof, namely at a point where the metal-oxide formations 144 contact the protuberances 146 of the substrate 140. This may be accomplished by submerging the substrate 140 in an acidic solution having a pH from about 1 pH to about 7 pH, in embodiments, from about 1 pH to about 3 pH at a temperature of from about 0° C. to about 100° C., in embodiments, from about 20° C. to about 40° C. for a period of from about 0 minutes to about 500 minutes, in embodiments, from about 30 minutes to about 120 minutes. This process widens the base of the pores 148 forming an inverted mushroom shape as shown in FIG. 4G.

In step 212, a catalyst material 162 is embedded in the widened pores 148. The substrate 140 is submerged in a solution having a pH from about 4 pH to about 10 pH, in embodiments, from about 6 pH to about 8 pH at a temperature of from about 0° C. to about 100° C., in embodiments, from about 20° C. to about 40° C. for a period of from about 0.5 minutes to about 300 minutes, in embodiments, from about 1 minutes to about 60 minutes and supplying a voltage to the solution of from about 0.5 V to about 100 V, in embodiments, from about 5 V to about 40 V pulsed at a frequency of from about 5 Hz to about 2000 Hz, in embodiments, from about 50 Hz to about 200 Hz. This process deposits the catalyst materials 162, namely, nickel metal into the widened pores 148. Examples of suitable metals that can act as catalysts include noble metals, such as ruthenium, rhodium, palladium, silver, osmium, iridium, platinum, gold; metal catalysts, such as nickel, copper, cobalt, iron; metal oxide catalysts such as iron oxide, ruthenium oxide; photo catalysts such as titanium oxide, copper-iron loaded titanium oxide and silicone oxide, sodium tantalite with co-catalyst nickel oxide, bimetal catalysts such as platinum-ruthenium, platinum-gold, and combinations thereof. The catalyst material 162 can be provided as a salt or organic compound, examples of which include metal halides, such as nickel chloride, platinum chloride, and combinations thereof.

The following Examples are being submitted to illustrate embodiments of the present disclosure. These Examples are intended to be illustrative only and are not intended to limit the scope of the present disclosure. Also, parts and percentages are by weight unless otherwise indicated. As used herein, "room temperature" refers to a temperature of from about 20° C. to about 30° C.

Example 1

Embedding Catalysts in Nanoporous Alumina

An aluminum tubular substrate was electro-polished to smooth out the surface thereof. The substrate was by submerged in an acidic solution of perchloric acid (85% by volume) and ethanol (1:7 volume ratio) at a temperature of about 5° C. for a period of about 3 minutes and supplying a voltage of about 20 V DC to the solution.

The polished substrate was then anodized to form a metal-oxide layer thereon by submerging the substrate in an acidic solution of 0.3M oxalic acid at a temperature of about 5° C. for a period of about 4 hours and supplying a voltage of about 40 V to the solution. The metal-oxide layer was then removed to form protuberances on the surface thereof by submerging the substrate in an acidic 85% by weight solution of chromium oxide ($Cr_2O_3$) and phosphoric acid ($H_3PO_4$) at a temperature of about 60° C. for a period of about 3 hours. The substrate was then anodized the second time to form a porous metal-oxide layer by submerging the substrate in an acidic solution of 0.3M oxalic acid at a temperature of about 5° C. for a period of about 4 hours and supplying a voltage of about 40 V to the solution.

Pores were formed within the metal-oxide layer by submerging the substrate in an acidic solution of 0.3M oxalic acid at a temperature of about 5° C. for a period of about 300 seconds and supplying a voltage of about 10 V to the solution. The pore formation process was performed within the same solution as the second anodization with the voltage decreased from about 40 V to about 10 V at a rate of about −0.1 V/s.

The pores were then widened by submerging the substrate 140 in an acidic solution of 5% by weight of $H_3PO_4$ at a temperature of about 60° C. for a period of about 40 minutes. Nickel was then embedded within the pores by submerging the substrate in a solution of 300 g/L $NiSO_4*6H_2O$ at a temperature of about 35° C. for a period of about 3 minutes and supplying a voltage of about 18 V pulsed at approximately 170 Hz to the solution.

Figure 6A:
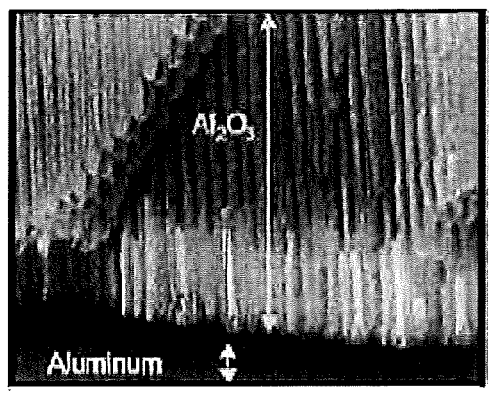
FIG. 6A is scanning electron microscope image of a cross-sectional view of a catalyst embedded metal oxide layer according to the present disclosure.
Figure 6B:
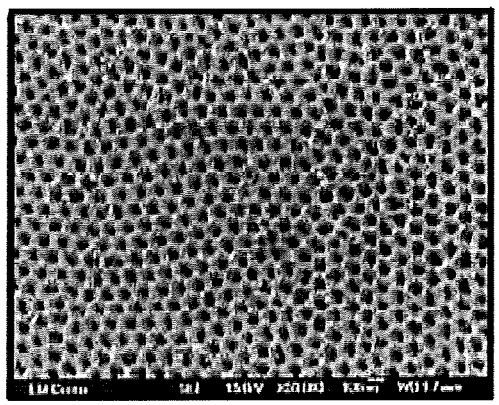
FIG. 6B is scanning electron microscope image of a top view of a catalyst embedded metal oxide layer according to the present disclosure.

FIGS. 6A and 6B illustrate a cross-sectional view and a top view of the embedded nickel oxide layer on the surface of the substrate taken using a scanning electron microscope. As shown in FIGS. 6A and 6B, nickel was located at the openings of the porous oxide layer, which aids in the catalytic action and prevents arc formation.

Example 2

Tissue Removal

Figure 7:
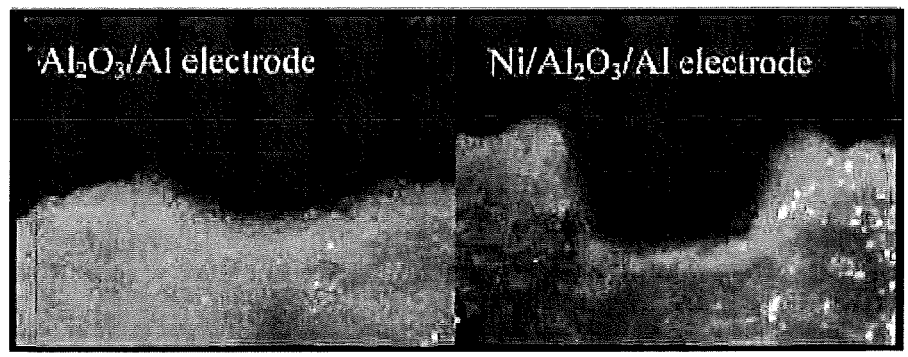
FIG. 7 is a photograph of a cross-sectional view of plasma-treated tissue according to the present disclosure.
Figure 8:
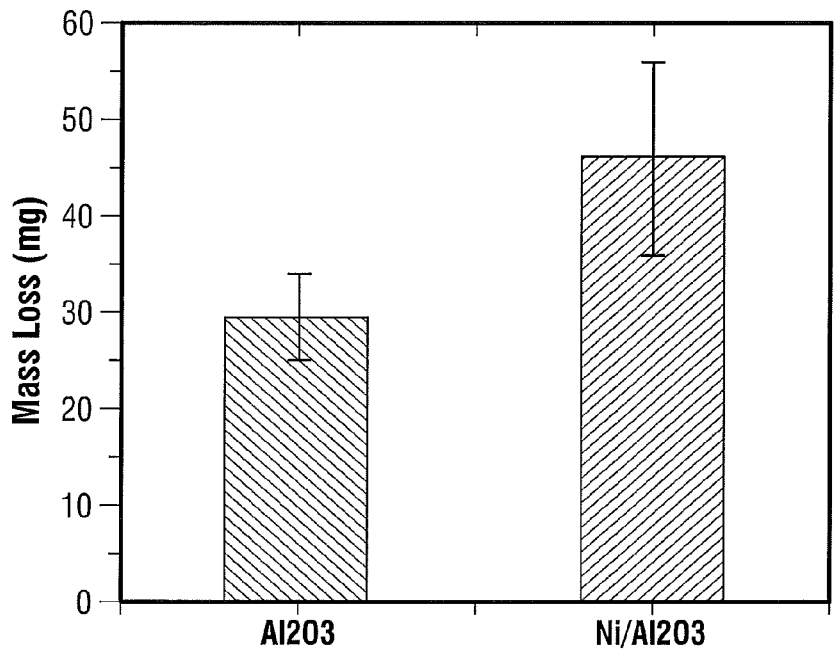
FIG. 8 is a bar graph illustrating mass loss of plasma-treated tissue according to the present disclosure.

FIG. 7 illustrates effects of plasma on ex vivo chicken muscle tissue when applied through an aluminum electrode coated with aluminum oxide and through an aluminum electrode coated with aluminum oxide and nickel embedded within the pores thereof, as discussed in Example 1. The presence of embedded nickel catalysts resulted in twice as deep tissue removal. Relative mass loss of the removed tissue is illustrated by the bar graph of FIG. 8. The plasma generated in the presence of embedded nickel catalysts also resulted in twice as much mass removal.

Figure 9:
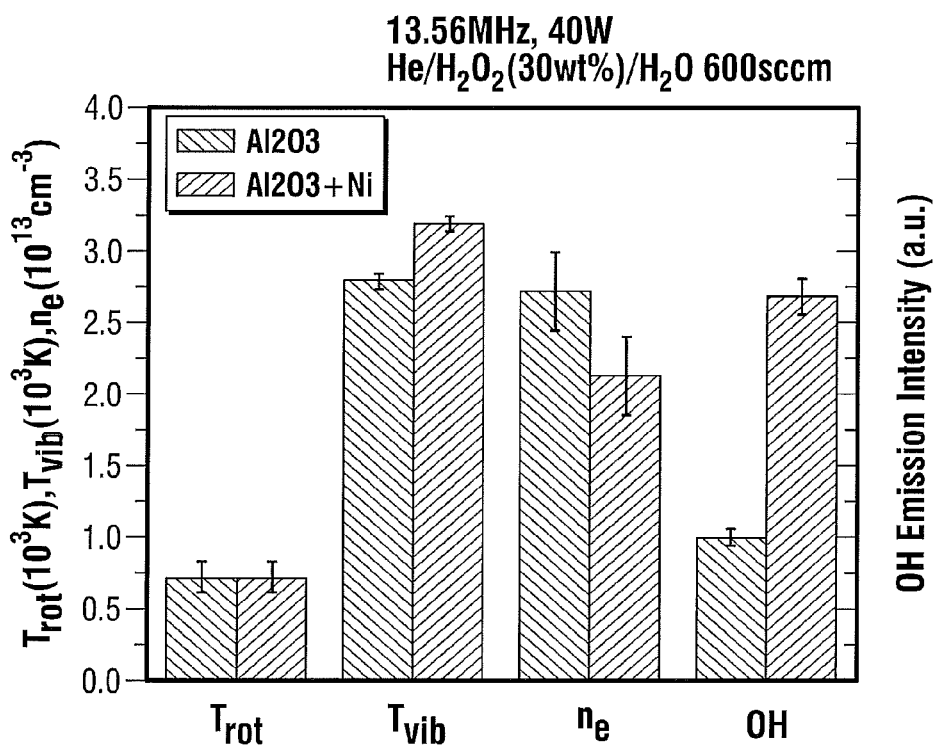
FIG. 9 is a bar graph illustrating emission spectra of plasma species generated by plasma in the presence and in the absence of embedded nickel catalysts according to the present disclosure.

FIG. 9 illustrates a comparison bar graph of emission spectra of plasma species generated by plasma in the presence and in the absence of embedded nickel catalysts. The plasma generated in the presence of embedded nickel catalysts resulted in twice as many hydroxyl radicals. The increase in tissue removal depth and mass may be attributed to the similar increase in the production of hydroxyl radicals due to the presence of embedded nickel catalysts.

Although the illustrative embodiments of the present disclosure have been described herein with reference to the accompanying drawings, it is to be understood that the disclosure is not limited to those precise embodiments, and that various other changes and modifications may be effected therein by one skilled in the art without departing from the scope or spirit of the disclosure. In particular, as discussed above this allows the tailoring of the relative populations of plasma species to meet needs for the specific process desired on the workpiece surface or in the volume of the reactive plasma.

What is claimed is:

1. A plasma device comprising:
   an outer electrode having a substantially cylindrical tubular shape defining a lumen therethrough; and
   an inner electrode coaxially disposed within the lumen, the inner electrode having a substantially cylindrical shape, wherein at least one of the outer electrode or the inner electrode includes a nanoporous dielectric coating disposed on at least a portion thereof, the nanoporous dielectric layer including a plurality of pores, wherein at least a portion of the plurality of pores include a catalyst embedded therein.

2. The plasma device according to claim 1, wherein the dielectric coating is selected from the group consisting of an oxide, a nitride, a native oxide and a native nitride.

3. The plasma device according to claim 1, wherein the outer electrode and the inner electrode are formed from a metal alloy that is selected from the group consisting of an aluminum alloy and a titanium alloy.

4. The plasma device according to claim 1, wherein the catalyst is selected from the group consisting of ruthenium, rhodium, palladium, silver, osmium, iridium, platinum, gold, nickel, copper, cobalt, iron, and oxides and bimetal combinations thereof.

5. A plasma system comprising:
   a plasma device comprising:
      an outer electrode having a substantially cylindrical tubular shape defining a lumen therethrough; and
      an inner electrode coaxially disposed within the lumen, the inner electrode having a substantially cylindrical shape, wherein at least one of the outer electrode or inner electrode includes a nanoporous dielectric coating disposed on at least a portion thereof, the nanoporous dielectric layer including a plurality of pores, wherein at least a portion of the plurality of pores include a catalyst embedded therein;
   an ionizable media source coupled to the plasma device and configured to supply ionizable media thereto; and
   a power source coupled to the inner and outer electrodes and configured to ignite the ionizable media at the plasma device to form a plasma effluent.

6. The plasma system according to claim 5, wherein the catalyst is selected from the group consisting of ruthenium, rhodium, palladium, silver, osmium, iridium, platinum, gold, nickel, copper, cobalt, iron, and oxides and bimetal combinations thereof.

7. The plasma system according to claim 5, wherein the dielectric coating is selected from the group consisting of an oxide, a nitride, a native oxide and a native nitride.

8. The plasma system according to claim 5, wherein the outer and inner electrodes are formed from a metal alloy that is selected from the group consisting of an aluminum alloy and a titanium alloy.

* * * * *